United States Patent
Song et al.

(10) Patent No.: US 11,742,357 B2
(45) Date of Patent: Aug. 29, 2023

(54) DISPLAY DEVICE

(71) Applicant: Samsung Display Co., Ltd., Yongin-Si (KR)

(72) Inventors: Hyun Seop Song, Bucheon-si (KR); Seung Jae Kang, Asan-si (KR); Yeon-Sung Kim, Suwon-si (KR); Po-Yun Park, Seoul (KR); Bong Chun Park, Incheon (KR); Il Hyun Yang, Cheonan-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 16/685,061

(22) Filed: Nov. 15, 2019

(65) Prior Publication Data
US 2020/0161337 A1    May 21, 2020

(30) Foreign Application Priority Data

Nov. 15, 2018    (KR) .................. 10-2018-0140836

(51) Int. Cl.
| | |
|---|---|
| *H01L 27/12* | (2006.01) |
| *H01L 23/528* | (2006.01) |
| *G02F 1/1345* | (2006.01) |
| *H01L 27/02* | (2006.01) |
| *H10K 59/131* | (2023.01) |
| *H05K 1/11* | (2006.01) |
| *H05K 1/18* | (2006.01) |
| *H05K 3/32* | (2006.01) |

(52) U.S. Cl.
CPC ........ *H01L 27/124* (2013.01); *G02F 1/13452* (2013.01); *H01L 23/528* (2013.01);
(Continued)

(58) Field of Classification Search
CPC .............. H01L 27/127; H01L 27/3276; H01L 27/3297; H01L 27/0207; H01L 27/124;
(Continued)

(56) References Cited

U.S. PATENT DOCUMENTS 8,670,101 B2 *   3/2014   Cho ................. G02F 1/1345
                                                    349/152
9,198,291 B2 *  11/2015   Oh .......................... H05K 1/14
(Continued)

FOREIGN PATENT DOCUMENTS

KR    10-2005-0040283 A    5/2005
KR       10-0821540 B1     4/2008
(Continued)

*Primary Examiner* — Mary A Wilczewski
*Assistant Examiner* — Diana C Vieira
(74) *Attorney, Agent, or Firm* — Innovation Counsel LLP

(57) ABSTRACT

A display device includes a substrate, pixels on the substrate, pads, and test lines. The pads are between the pixels and an edge of the substrate and include a first pad and a second pad. The test lines include a first test line and a second test line. The first test line includes a first section and a second section. The second section is closer to the edge of the substrate than the first section and is connected through the first section to the first pad. The second test line includes a first segment and a second segment. The second segment is closer to the edge of the substrate than the first segment and is connected through the first segment to the second pad. A minimum distance between the first section and the first segment is larger than a minimum distance between the second section and the second segment.

19 Claims, 11 Drawing Sheets

(52) U.S. Cl.
CPC ....... *H01L 27/0207* (2013.01); *H10K 59/131* (2023.02); *H05K 1/118* (2013.01); *H05K 1/189* (2013.01); *H05K 3/323* (2013.01)

(58) Field of Classification Search
CPC ................ H01L 22/30; G02F 1/13452; G02F 1/136254; G02F 1/1309; G02F 1/13458; G02F 1/1345; H05K 3/323; H05K 1/118; H05K 1/189; H05K 1/111; H05K 1/181; H05K 2201/10128; H05K 3/361; H05K 1/147

See application file for complete search history.

(56) References Cited

U.S. PATENT DOCUMENTS

| | | | |
|---|---|---|---|
| 2008/0173900 | A1 | 7/2008 | Yoon et al. |
| 2011/0234932 | A1 | 9/2011 | Jung et al. |
| 2015/0129947 | A1 | 5/2015 | Nagashima et al. |
| 2015/0160523 | A1* | 6/2015 | Fukami ............. G02F 1/136204 349/47 |
| 2015/0230337 | A1* | 8/2015 | Kim ....................... H05K 1/189 361/751 |
| 2016/0165718 | A1 | 6/2016 | Oh |
| 2017/0092711 | A1* | 3/2017 | Tsai ................... H01L 27/3276 |

FOREIGN PATENT DOCUMENTS

| | | |
|---|---|---|
| KR | 10-0895311 B1 | 5/2009 |
| KR | 10-2015-0033029 A | 4/2015 |

\* cited by examiner

DISPLAY DEVICE

CROSS-REFERENCE TO RELATED APPLICATION

This application claims priority to and the benefit of Korean Patent Application No. 10-2018-0140836 filed in the Korean Intellectual Property Office on Nov. 15, 2018; the entire contents of the Korean Patent Application are incorporated herein by reference.

BACKGROUND

(a) Technical Field

This technical field relates to a display device.

(b) Description of the Related Art

A display device, such as a liquid crystal display (LCD) or organic light emitting diode display (OLED), typically includes a display panel for displaying an image. The display device may include a driver (such as a gate driver and a data driver) for driving the display panel.

During the manufacturing process of the display panel, a step of testing an electrical operation state of elements formed in the display panel may be performed. Signals may be provided through test lines to the elements for performing the testing.

The above information disclosed in this Background section is for enhancement of understanding of the background of this application. This Background section may contain information that does not form the prior art that is already known in this country to a person of ordinary skill in the art.

SUMMARY

Embodiments may be related to a display device in which potential defects are prevented.

A display device according to an embodiment includes the following elements: a substrate including a display area and a non-display area; a pad region in which a plurality of pads are arranged, the pad being in the non-display area; and a test line region in which a plurality of test lines are arranged, the test line region being between the pad region and an edge of the substrate adjacent to the pad region in a first direction, and the plurality of test lines being arranged in a second direction crossing the first direction. Each of the plurality of test lines includes a first end portion adjacent to the pad region and a second end portion adjacent to the edge of the substrate, and a first interval between the first end portions of two test lines at an outermost in the second direction among the plurality of test lines is larger than a second interval between the second end portions.

One end of each of the plurality of test lines may be connected to one pad among the plurality of pads, and the other end of each test line may be in contact with the edge of the substrate.

The two test lines may be inclined with respect to the first direction and the second direction so that the second end portions may be toward a center of the test line region.

The two test lines may be symmetrical to a center of the test line region.

The two test lines may be straight in the test line region.

A slope of the plurality of test lines may gradually decrease toward an outermost part of the test line region.

An acute angle between one test line of the two test lines and the edge of the substrate may be smaller than an acute angle of a test line among the plurality of test lines adjacent to the one test line and the edge of the substrate.

An interval between the second end portions of the plurality of test lines may not be constant.

The plurality of test lines may form a plurality of test lines groups, and two test lines at an outermost in each test line group may be inclined toward the center of the test line group.

The two test lines may be bent one time or more in the test line region.

The two test lines may include a first portion extending in the first direction, a second portion extending from the first portion toward the center of the test line region in the second direction, and a third portion extending from the second portion in the first direction.

The two test lines may be curved in the test line region.

The display device may further include a flexible printed circuit board bonded to the pad region, and the flexible printed circuit board may overlap the test line region.

The display device may further include an anisotropic conductive layer between the pad region and the flexible printed circuit board, and the anisotropic conductive layer may not overlap the test line region.

A display device according to an embodiment includes the following elements: a substrate including a pad region in which a plurality of pads are arranged and a test line region in which a plurality of test lines connected to the plurality of pads are arranged; and a flexible printed circuit board overlapping the pad region and the test line region, the flexible printed circuit board being bonded to the pad region, wherein test lines adjacent to both ends of the test line region among the plurality of test lines include first end portions adjacent to the pad region and second end portions adjacent to an edge of the substrate, and an interval between the second end portions is smaller than an interval between the first end portions.

The interval of the test lines may gradually decrease from the first end portions toward the second end portions.

The plurality of test lines may be straight in the test line region.

The plurality of test lines may contain test lines that are bent two times or more in the test line region.

The plurality of test lines may include the test lines that are curved in the test line region.

The flexible printed circuit board may not be bonded to the test line region.

An embodiment may be related to a display device. The display device may include a substrate, pixels positioned on the substrate, connecting lines, pads, and conductive lines. The pads may be electrically connected through the connecting lines to the pixels, may be positioned between the pixels and an edge of the substrate, and may include a first pad and a second pad. The conductive lines may be electrically connected through the pads to the connecting lines and may include a first conductive line and a second conductive line. The first conductive line may include a first first-line section and a second first-line section. The second first-line section may be positioned closer to the edge of the substrate than the first first-line section and may be electrically connected through the first first-line section to the first pad. The second conductive line may include a first second-line section and a second second-line section. The second second-line section may be positioned closer to the edge of the substrate than the first second-line section and may be electrically connected through the first second-line section to the second pad. A minimum distance between the first first-line section and the first second-line section may be larger than a minimum distance between the second first-line section and the second second-line section.

The first first-line section and the first second-line section respectively directly contact the first pad and the second pad. Each of the second first-line section and the second second-line section directly contacts the edge of the substrate.

The second first-line section and the second second-line section may be inclined with respect to the edge of the substrate and converge toward an intersection of the edge of the substrate and a geometric center line of the conductive lines.

The second first-line section may be a mirror image of the second second-line section with reference to a geometric center line of the conductive lines.

Both the second first-line section and the second second-line section may be straight.

The pads may further include a third pad. The conductive lines may further include a third conductive line. The third conductive line may include a first third-line section and a second third-line section. The second third-line section may be positioned closer to the edge of the substrate than the first third-line section, may be electrically connected through the first third-line section to the third pad, and may be positioned between the second first-line section and the second second-line section. The second first-line section may be oriented at a first acute angle relative to the edge of the substrate. The second third-line section may be oriented at a second acute angle relative to the edge of the substrate. The second acute angle may be greater than the first acute angle.

The pads may further include a fourth pad. The conductive lines may further include a fourth conductive line. The fourth conductive line may include a first fourth-line section and a second fourth-line section. The second fourth-line section may be positioned closer to the edge of the substrate than the first fourth-line section, may be electrically connected through the first fourth-line section to the fourth pad, and may be positioned between the second third-line section and the second second-line section. The second fourth-line section may be oriented at a third acute angle relative to the edge of the substrate. The third acute angle may be greater than the second acute angle.

Ends of the conductive lines may directly contact the edge of the substrate and may have unequal intervals.

The conductive lines may include conductive lines groups. The conductive line groups may include a first conductive line group. The first conductive line group may include the first conductive line and the second conductive line. The second first-line section and the second second-line section may converge toward an intersection of the edge of the substrate and a geometric center line of the first conductive line group.

The second first-line section may be not aligned with the first first-line section.

The first conductive line may further include a third first-line section connected between the first first-line section and the second first-line section and being bent relative to each of the first first-line section and the second first-line section.

The second first-line section may be curved.

The display device may include a flexible printed circuit board overlapping the conductive lines.

The display device may include an anisotropic conductive layer between the pads and the flexible printed circuit board. The anisotropic conductive layer may not overlap the conductive lines.

The display device may include a flexible printed circuit board overlapping the pads, overlapping the conductive lines, and bonded to the substrate.

Distances between the second first-line section and the second second-line section may decrease toward the edge of the substrate.

The second first-line section may be perpendicular to the edge of the substrate and may be positioned between the first first-line section and the second second-line section.

The first conductive line may include two or more bends.

At least one of the first first-line section and the second first-line section may be curved.

The first conductive line may be not positioned between the second conductive line and any of the conductive lines.

According to embodiments, even if liquid flows to one side or both sides of a test line region in a display device, it is possible to prevent defects such as a short or a burnt portion at the test line region.

BRIEF DESCRIPTION OF THE DRAWINGS

Each of FIG. 5, FIG. 6, FIG. 7, FIG. 8.

DETAILED DESCRIPTION OF EMBODIMENTS

Figure 1:
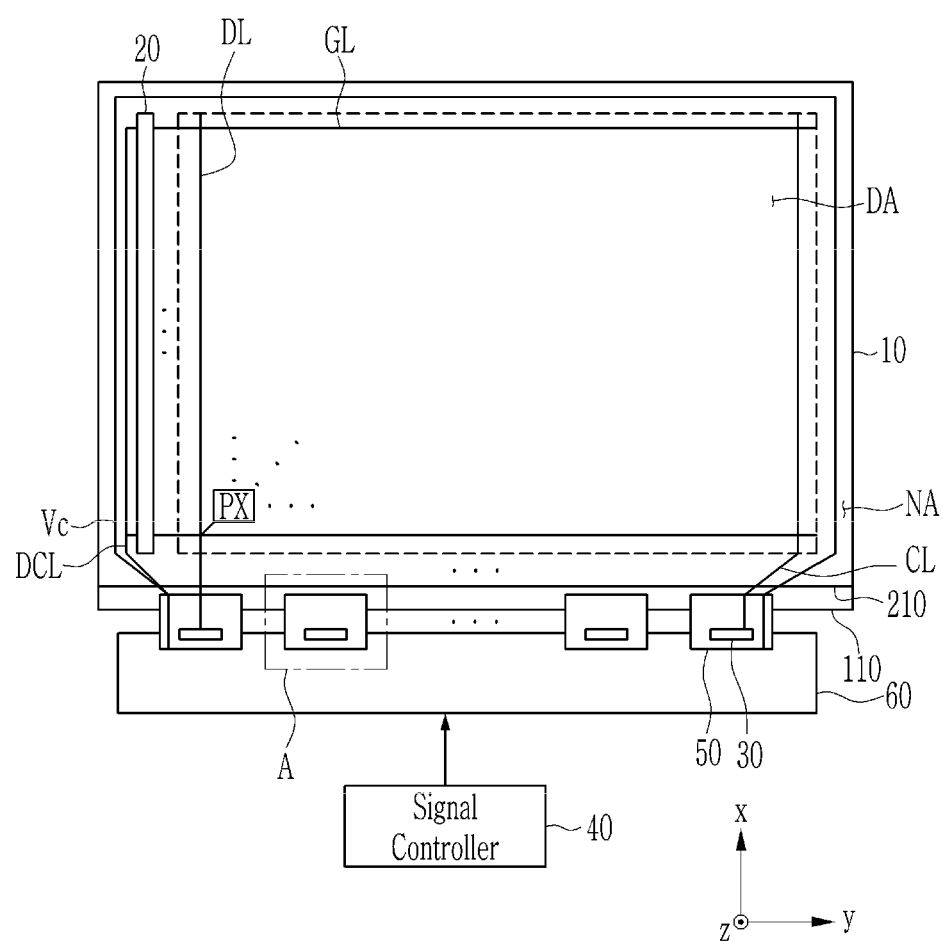
FIG. 1 is a plan view schematically showing a display device according to an embodiment.

Example embodiments are described with reference to the accompanying drawings. The described embodiments may be modified in various ways.

Like reference numerals may designate like elements in the specification. In the drawings, thicknesses or sizes of respective layers and areas may be enlarged or reduced to clearly illustrate their arrangements and relative positions.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

When a first element is referred to as being "on" a second element, the first element can be directly on the second element, or at least one intervening element may be present between the first element and the second element. When a first element is referred to as being "directly on" a second element, there are no intended intervening elements (except environmental elements such as air) present between the first element and the second element.

Unless explicitly described to the contrary, the word "comprise" and variations such as "comprises" or "comprising" may imply the inclusion of stated elements but not the exclusion of any other elements.

In the drawings, a reference character x is used to indicate a first direction, a reference character y is used to indicate a second direction perpendicular to the first direction, and a reference character z is used to indicate a third direction perpendicular to the first direction and the second direction. The term "connect" may mean "electrically connect." The term "insulate" may mean "electrically insulate." The term "contact" may mean "directly contact" or "direct contact." The term "conductive" may mean "electrically conductive." The term "column" may mean "row." The term "interval" may mean "distance." The term "test line" may mean "conductive line."

FIG. 1 is a view schematically showing a display device according to an embodiment.

Referring to FIG. 1, the display device includes a display panel 10, a gate driver 20, a data driver 30, a signal controller 40, etc.

The display panel 10 includes a display area DA corresponding to a screen on which an image is displayed, and a non-display area NA on which the image around the display area DA is not displayed. In the display panel 10, various elements and wirings used for displaying the image by receiving signals from the outside are formed between a substrate 110 and a substrate 210. The display area DA and the non-display area NA are regions that are separated based on a plan view, so that the substrate 110 has a display area DA corresponding to the display area DA of the display panel 10 and a non-display area NA corresponding to the non-display area NA of the display panel 10.

Pixels PX for displaying the image are disposed in the display area DA, and gate lines GL and data lines DL are connected to the pixels PX for applying the signals to the pixels PX. Each data line DL extends substantially in a first direction x, and each gate line GL extends substantially in second direction y. The gate lines GL and the data lines DL may cross and may be insulated from each other.

In the case of the liquid crystal display, the pixel PX includes a transistor, a liquid crystal capacitor, and a storage capacitor. The liquid crystal capacitor may be composed of a pixel electrode, a common electrode, and a liquid crystal layer. A gate electrode of the transistor may be connected to a gate line, a source electrode of the transistor may be connected to a data line, and a drain electrode of the transistor may be connected to a pixel electrode of the liquid crystal capacitor and a first electrode of the storage capacitor. The common electrode of the liquid crystal capacitor may receive a common voltage, and the second electrode of the storage capacitor may receive a storage voltage.

The gate driver 20 applying the gate signal to the gate lines GL is disposed in the non-display area NA. The gate driver 20 may be directly integrated in the non-display area NA. The gate driver 20 may be formed to be elongated in the first direction x.

The data lines DL of the display area DA may receive data signals from the data driver 30 and may transmit the data signals to the pixels PX. The data driver 30 may be mounted on a flexible printed circuit board (FPCB) 50 as an integration circuit (IC) chip type. One end of the FPCB 50 may be bonded to the pad region of the display panel 10. The data signals output from the data driver 30 may be input to the pads of the pad region of the display panel 10 through the wires of the FPCB 50, and may be transmitted to the data lines DL through the data connecting lines CL connecting the pads and the data lines DL. The display panel 10 may include a plurality of pad regions separated in the second direction y, and one FPCB 50 may be bonded to each pad region. Depending on the size of the display panel 10, the display panel 10 may include one pad region. The data lines DL may be directly connected to the pads.

The gate driver 20 and the data driver 30 may be controlled by the signal controller 40. The other end of the FPCB 50 may be bonded to a printed circuit board (PCB) 60, and the PCB 60 may transmit signals from the signal controller 40 to the gate driver 20 and the data driver 30 through the FPCB 50. The signal controller 40 may be mounted on the PCB 60 as an IC chip type. The signals provided from the signal controller 40 to the gate driver 20 may be input to the pads disposed in the pad regions of the display panel 10 through the wires of the FPCB 50, and may be transmitted to the gate driver 20 through the driver control signal line DCL disposed in the display panel 10. The signals provided from the signal controller 40 to the gate driver 20 through the driver control signal line DCL may include signals such as a vertical start signal, a clock signal, etc., and signals providing a low voltage of a predetermined level. Some signals may be provided from other devices apart from the signal controller 40. To avoid complication of the drawing, in FIG. 1, the driver control signal line DCL is shown as a single line, but the driver control signal line DCL may include a number of signal lines corresponding to the types of signals transferred to the gate driver 20, or may include more or fewer signal lines.

The gate driver 20 receives the vertical start signal, the clock signals, and the low voltage corresponding to a gate-off voltage through the driver control signal line DCL to generate the gate signal (a gate-on voltage and a gate-off voltage) to be applied to the gate lines GL. The gate driver 20 may include stages generating and outputting the gate signal by using these signals and being dependently connected to each other. The stages are connected one-to-one with the gate lines GL, and may sequentially output the gate signals to the gate lines GL per frame. In the shown embodiment, the gate driver 20 is disposed on the left side of the display area DA, and may be further disposed on the right side.

A common voltage line VC may be disposed in the non-display area NA of the display panel 10. The common voltage line VC may be disposed to surround the display area DA. The common voltage line VC may transmit the common voltage input through the FPCB 50 to the common electrode.

Figure 2:
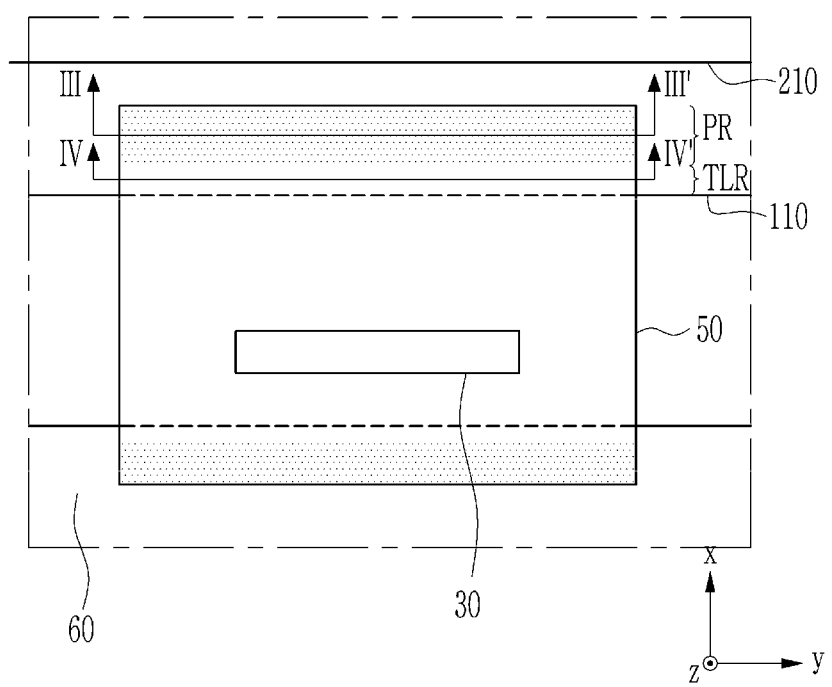
FIG. 2 is a plan view of a region A in FIG. 1 according to an embodiment.
Figure 3:
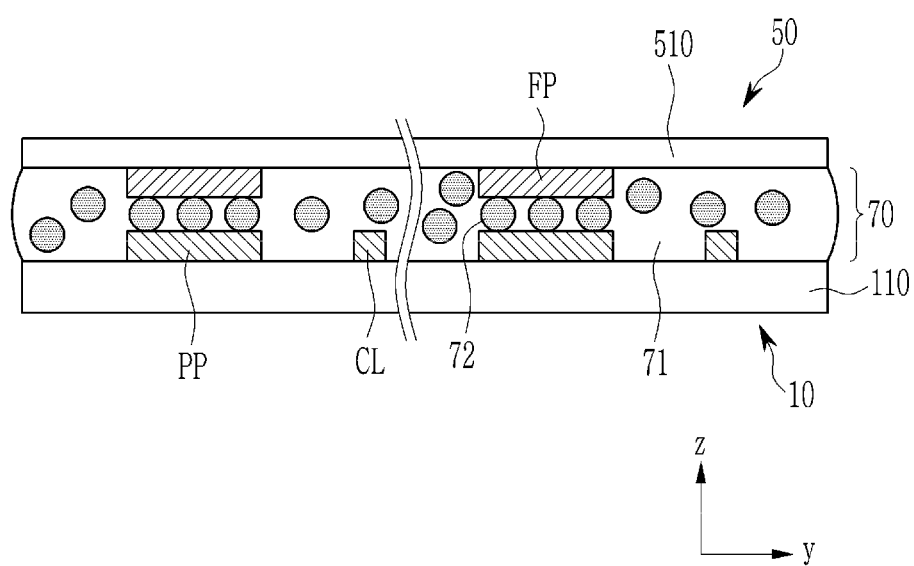
FIG. 3 is a cross-sectional view taken along a line III-III' of FIG. 2 according to an embodiment.
Figure 4:
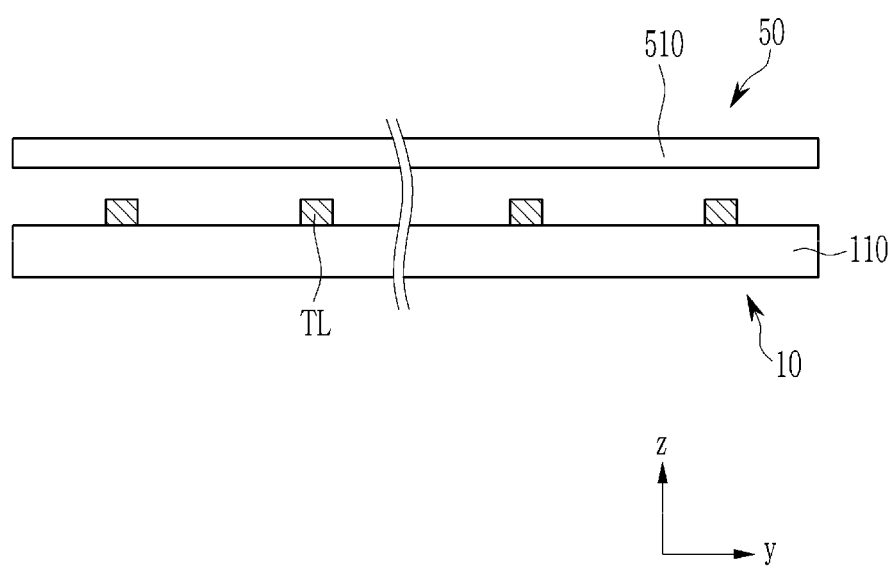
FIG. 4 is a cross-sectional view taken along a line IV-IV' in FIG. 2 according to an embodiment.

FIG. 2 is a plan view of a region A in FIG. 1, FIG. 3 is a cross-sectional view taken along a line III-III' of FIG. 2, and FIG. 4 is a cross-sectional view taken along a line IV-IV' in FIG. 2.

Referring to FIG. 2, FIG. 3, and FIG. 4, the display panel 10 includes the pad region PR disposed on the substrate 110. The pad region PR is disposed in the non-display area NA of the display panel 10 shown in FIG. 1, and may be disposed near the lower edge of the display panel 10, for example. Depending on the size of the display panel 10, the display panel 10 may include a plurality of pad regions PR. The pads PP that are connected to the data connecting lines CL, the driver control signal line DCL, the common voltage line VC, etc. are arranged in the pad region PR. The data connecting lines CL may extend to the pad region PR for bonding with the pads PP.

The display panel 10 also includes a test line region TLR between the pad region PR and the edge of the substrate 110. The test line region TLR is adjacent to the pad region PR and is in contact with the pad region PR. The test lines TL connected to the pads PP of the pad region PR are arranged in the test line region TLR. During the manufacturing process of the display panel 10, the test lines TL are connected to test pads for receiving signals to test the display panel 10, for example, signals to test whether the pixels PX operate normally. The test pads may be cut away according to the size of the display panel 10 after the testing of the display panel 10 and may not exist in the manufactured display panel 10. However, the test lines TL remain connected with the pads PP between the pad region PR and the edge of the substrate 110.

The FPCB 50 is bonded to the pad region PR. The FPCB 50 may include a substrate 510 and pads FP arranged on the substrate 510. For the bonding of FPCB 50, the pad region PR is not covered by the substrate 210, but is exposed before the FPCB 50 is bonded. An anisotropic conductive layer 70 may be used for a physical connection and an electrical connection between the FPCB 50 and the pad region PR. The anisotropic conductive layer 70 is a film in which conductive particles 72 are arranged in an insulating layer 71 such as a resin. The resin of the anisotropic conductive layer 70 may be in a hardened state, and may be a thermosetting or photocurable resin that is fully cured in the bonding process. The insulating layer 71 formed by curing the resin bonds the FPCB 50 to the pad region PR. The conductive particles 72 electrically connect the pads FP of the FPCB 50 to the pads PP of the display panel 10. Accordingly, signals may be transmitted from the pads FP of the FPCB 50 to the pads PP of the pad region PR through the conductive particles 72. Conversely, signals may be transmitted from the pads PP of the pad region PR to the pads FP of the FPCB 50 through the conductive particles 72.

The FPCB 50 is disposed to overlap the test line region TLR, but there is no anisotropic conductive layer 70 directly connected between the FPCB 50 and the test line region TLR, so there may be an empty space between the FPCB 50 and the test line region TLR. When the FPCB 50 is bonded to the pad region PR, since the resin of the anisotropic conductive layer 70 may flow to the periphery, the portion of the test line region TLR near the pad region PR may be bonded to the FPCB 50. However, an empty space may exist between most of the test line region TLRs and the FPCB 50.

When an electronic device (e.g., a monitor for a TV, a computer, etc.) including the display device is cleaned with and/or exposed to a liquid, such as water or a cleaning liquid, some of the liquid may flow toward the pad region PR. The pad region PR is covered with the anisotropic conductive layer 70, so that it is substantially sealed and may not allow the liquid to penetrate. However, since the test line region TLR is not sealed, some of the liquid may penetrate into the test line region TLR. Particularly, the liquid may penetrate into edge parts of the test line region TLR due to tension between the test line region TLR and the anisotropic conductive layer 70. Without the structures of one or more embodiments, the test lines TL which are disposed at the edge parts of the test line region TLR may be significantly exposed to liquid.

If the test lines TL are exposed to the liquid, a short may occur between test lines TL, and a potential difference may be generated between the pads PP connected to the test lines TL, resulting in a burnt defect in the pads PP or the wires connected to the pads PP. The test lines TL may be corroded and the corrosion may propagate to the pads PP to damage the pads PP. This may prevent the display panel 10 from operating normally, resulting in poor image quality.

Figure 5:
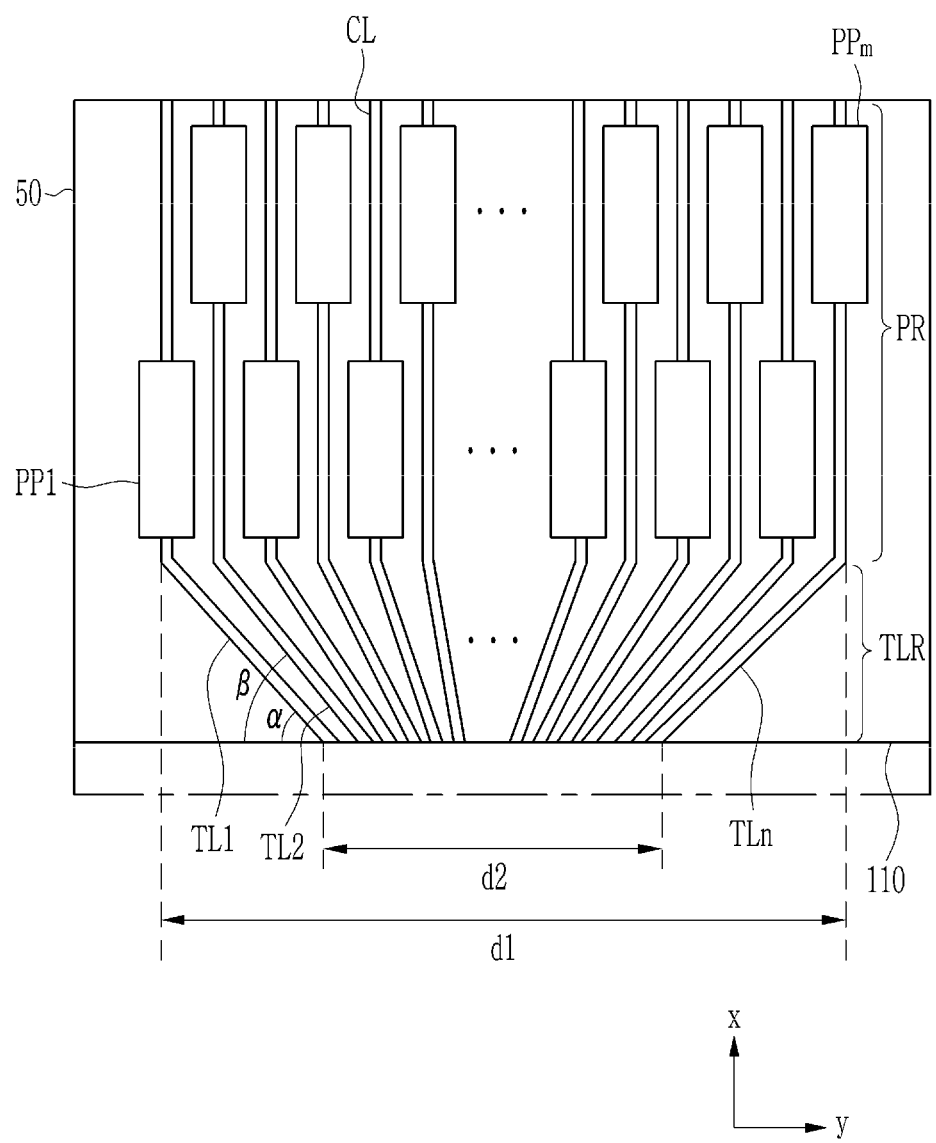

Each of FIG. 5, FIG. 6, FIG. 7, FIG. 8, and FIG. 9 is a top plan view of a pad region PR and a test line region TLR according to an embodiment. In order to show the positional relationship with the FPCB 50, the FPCB 50 is also shown in FIG. 5 to FIG. 9. The embodiment of FIG. 5 is first described, and different features are described for the embodiments of FIG. 6 to FIG. 9.

Referring to FIG. 5, pads $PP_1$-$PP_m$, are arranged in the second direction y in the pad region PR. The total number of pads $PP_1$-$PP_m$, arranged in the pad region PR may depend on the total number of pad regions PR included in the display panel 10, a resolution of the display panel 10, etc. Referring to FIG. 5, the pads PP1-PPm are arranged in two columns in the second direction y, but the pads PP1-PPm may be arranged in one column or three or more columns. Each of the pads PP1-PPm is connected to a data connecting line CL extending toward the display area DA, and is connected to a test line TL1-TLn extending toward the edge of the substrate 110. A wire different from the data connecting lines CL may be connected to at least one among the pads PP1-PPm. At least one of the pads PP1-PPm may be a dummy pad that is not connected with any conductive member. At least one of the pads PP1-PPm may not be connected to the test line TL1-TLn.

In the test line region TLR, the test lines TL1-TLn connected to the pads PP1-PPm are arranged in the second direction y. One end of each of the test lines TL1-TLn is (directly) connected with one of the pads PP1-PPm, and the other end thereof is in contact with or almost in contact with the edge of the substrate 110. The test lines TL1-TLn extend to the pad region PR for connection with the pads PP1-PPm, but may be represented by parts disposed in the test line region TLR.

The test lines TL1-TLn are disposed substantially in a funnel shape. That is, as the test lines TL1-TLn become closer to the edge of the substrate 110, they are gradually tilted toward the center of the test line region TLR. The slope of the test lines TL1-TLn may become smaller toward to the left and right outskirts of the test line region TLR. For example, an acute angle (α) between the edge of the substrate 110 and the first test line TL1 disposed at the leftmost edge may be smaller than an acute angle (β) between the edge of the substrate 110 and the second test line TL2 closer to the center of the test line region TLR than the first test line TL1.

In the interval between the test lines $TL_1$ and $TL_n$ disposed outermost in the second direction, the interval d2 of the parts close to the edge of the substrate 110 is smaller than the interval d1 of the parts adjacent to the pad region PR. In the interval between the adjacent test lines (e.g., $TL_1$ and $TL_2$), the interval of the second end portions (i.e., of the parts adjacent to the edge of the substrate 110) may be smaller than the interval of the first end portions (i.e., of the parts adjacent to the pad region PR). The interval of the first end portions depends on the interval of the pads PP1-PPm, so it is difficult to change the interval of the first end portions, however the interval of the second end portions may be designed relatively freely as long as they are not electrically connected to each other.

The angle of inclination of the test lines TL1-TLn toward the second direction y (corresponding to the edge of the substrate 110) is the largest at the outermost test lines TL1 and TLn, and may gradually decrease as the test lines are closer to the center of the test line region TLR. The sloped shape of the test lines TL1-TLn may be substantially symmetrical to the center of the test line region TLR. Some of the test lines TL1-TLn, for example, the test lines disposed at the center of the test line region TLR and near the center, are not inclined and may be substantially parallel to the first direction x.

Since the test lines TL1-TLn are disposed in this way, the test lines TL1-TLn may be disposed farther from edges of the test line region TLR than if the test lines TL1-TLn are disposed to be parallel, for example, to the first direction x. Therefore, even if liquid such as water flows to one or more sides of the test line region TLR, the test lines TL1-TLn may not be significantly wetted by the liquid. Advantageously, satisfactory performance of the display device may be maintained.

Figure 6:
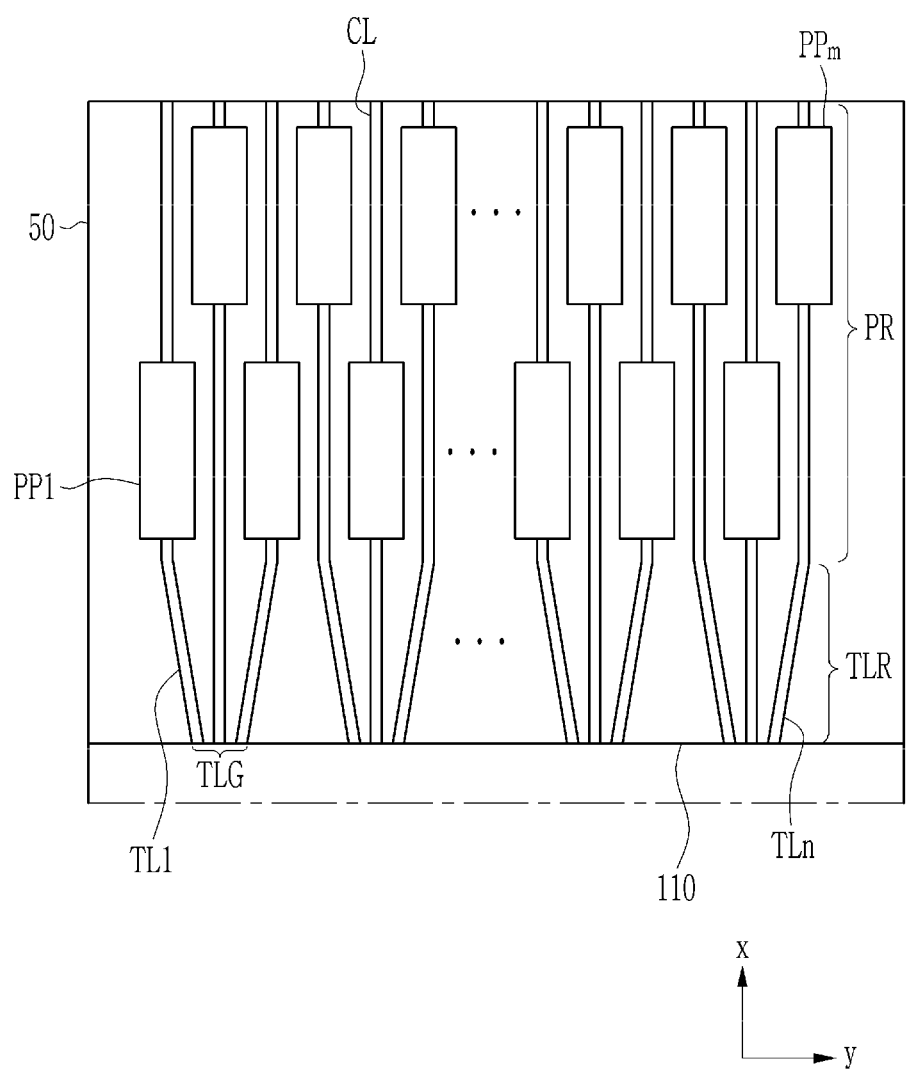

Referring to FIG. 6, the test lines TL1-TLn include several groups TLG. Side test lines belonging to each test line group TLG are inclined toward the intersection between the lower edge of the substrate 110 and the center line of the test line group TLG. The interval between the second end portions of the test lines TL1-TLn is not constant. The test line located at the center of the test line group TLG may not be inclined and/or may be substantially parallel to the first direction x. The outermost test lines TL1 and TLn are away from edges of the test line region TLR, so that the risk that they are wetted by liquid may be reduced.

Figure 7:
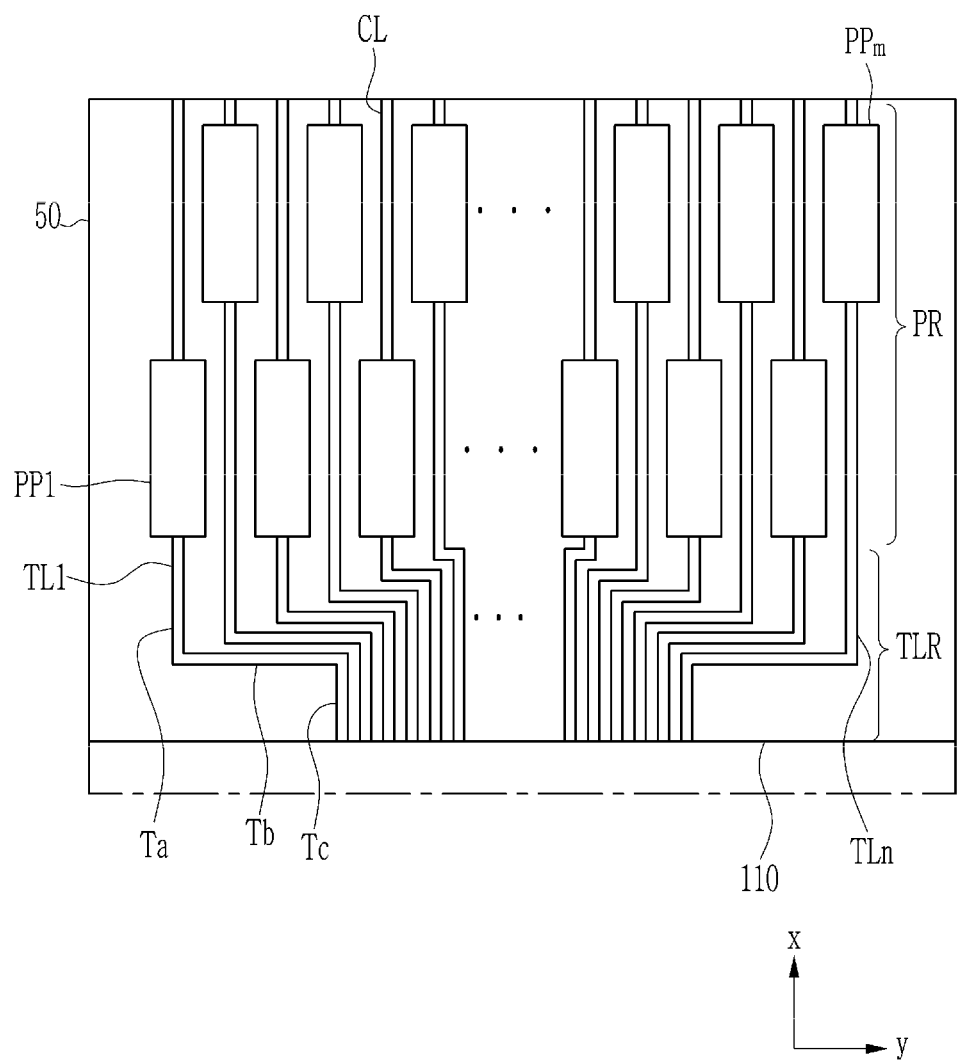

Referring to FIG. 7, each of the test lines TL1-TLn have two bent portions. The test lines TL1-TLn are bent so that the parts adjacent to the edge of the substrate 110 are closer to the center of the test line region TLR than the parts adjacent to the pad region PR. For example, the test line $TL_1$ includes a first part Ta connected to the pad $PP_1$ and extending substantially in the first direction x, a second part Tb extending from the first part Ta substantially in the second direction y toward the center of the test line region TLR, and a third part Tc extending from the second part Tb substantially in the first direction x and in contact with the edge of the substrate 110. The angle between the first part Ta and the second part Tb and/or the angle between the second part Tb and the third part Tc do not necessarily have to be right angles, but may be acute or obtuse angles. Thus, the first part Ta, the second part Tb, and the third part Tc may be inclined in the oblique direction. The test lines disposed at the center of the test line region TLR and near the center among the test lines TL1-TLn are not bent and may be substantially parallel to the first direction x.

Since the test lines TL1-TLn are disposed in this way, the risk that the test lines TL1-TLn are wetted by liquid may be reduced. According to embodiment, each of the test lines TL1-TLn may have one, two, three, or more bent portions.

Figure 8:
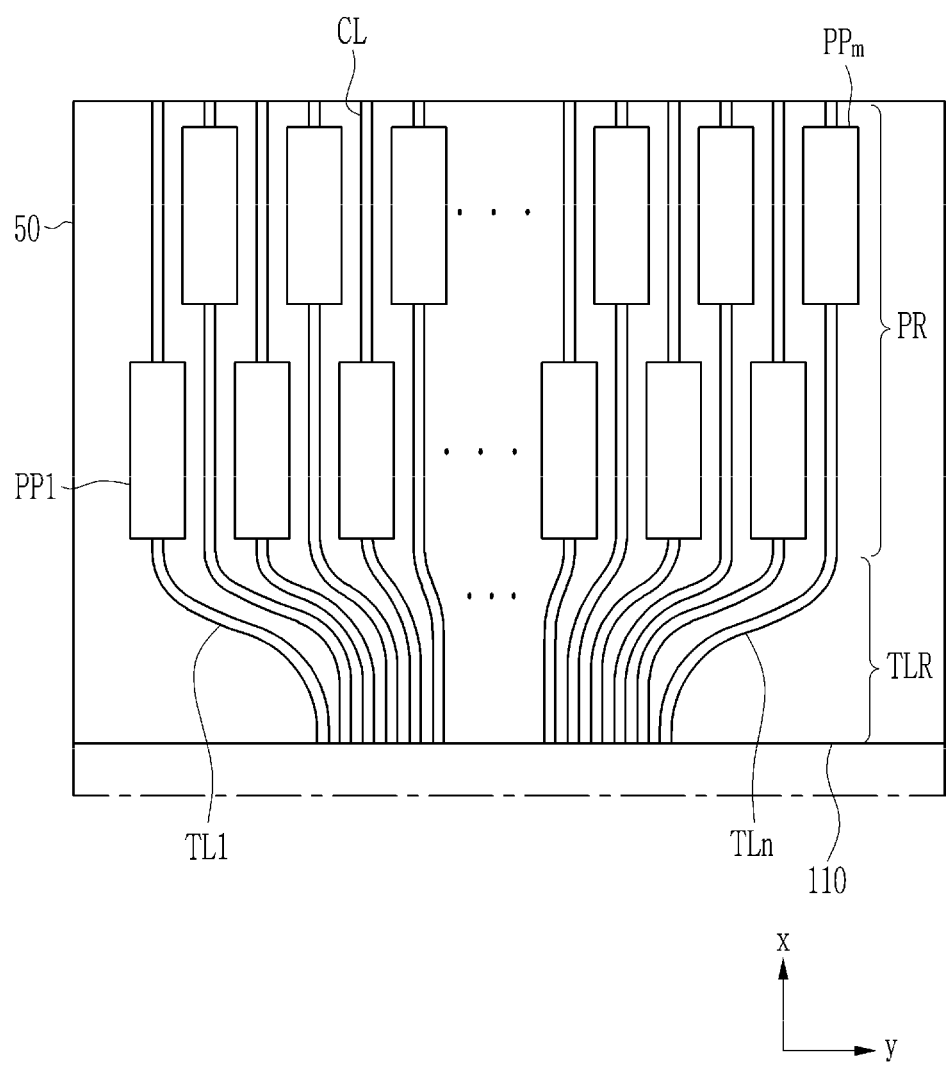

Referring to FIG. 8, the test lines TL1-TLn are curved. For example, the test lines TL1 and TLn and the test lines adjacent thereto may each include a curved line portion that is convex toward the center of the test line region TLR. As a result, more space may be secured at the left of the test line TL1 and the right of the test line TLn than in the case that the test lines TL1-TLn are straight and may be further away from two sides of the test line region TLR. Therefore, the risk of the wetting by liquid may be reduced. The test lines TL1-TLn may not contain inflection points, or may contain at least one inflection point. The test lines disposed at the center or near the center of the TLR among the test lines TL1-TLn are not curved and may be substantially parallel to the first direction x.

Figure 9:
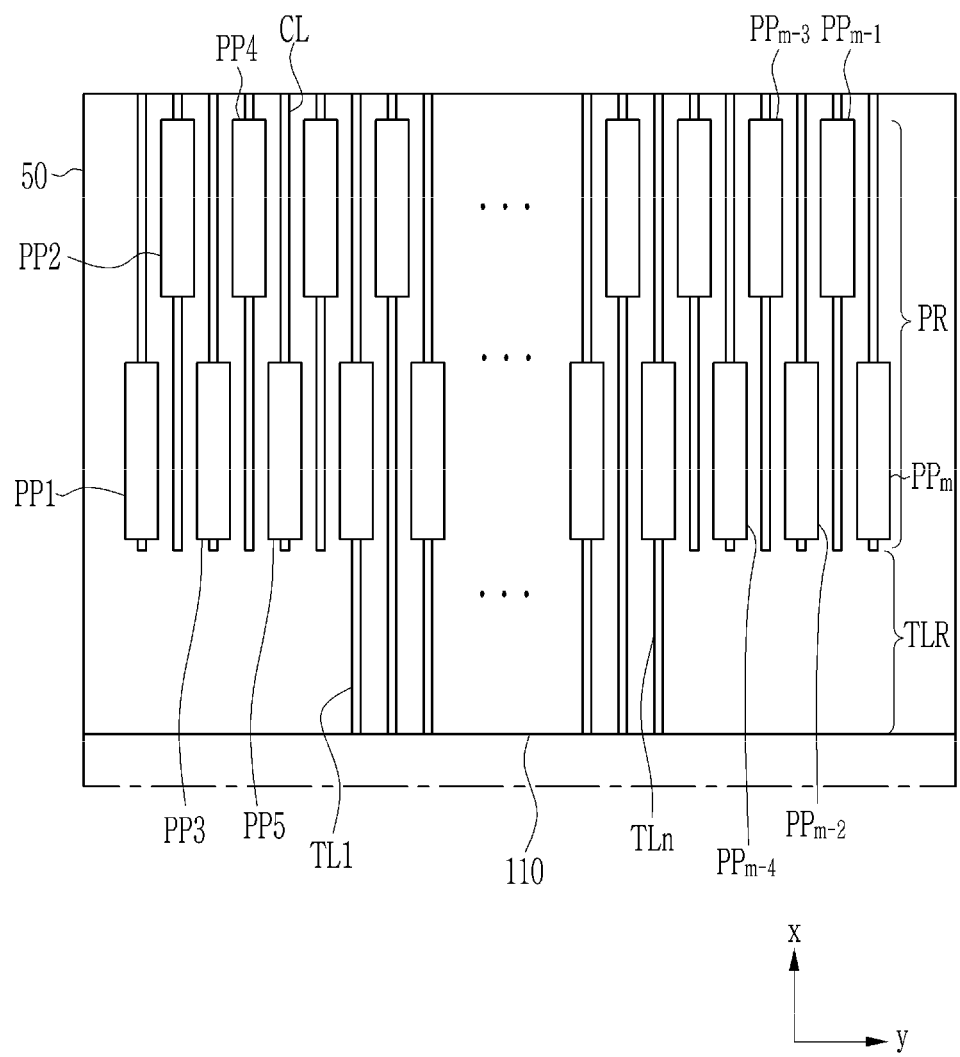
FIG. 9 is a top plan view of a pad region and a test line region according to an embodiment.

Referring to FIG. 9, test lines are not connected to the pads (e.g., $PP_1$-$PP_5$ and $PP_{m-4}$-$PP_m$) adjacent to two edges of the pad region PR. Since the test lines TL1-TLn may be disposed farther from both edges of the test line region TLR, although liquid inflows to two sides of the test line region TLR, the test lines TL1-TLn are less likely to be in contact with the liquid, thus potential defects may be prevented.

Figure 10:
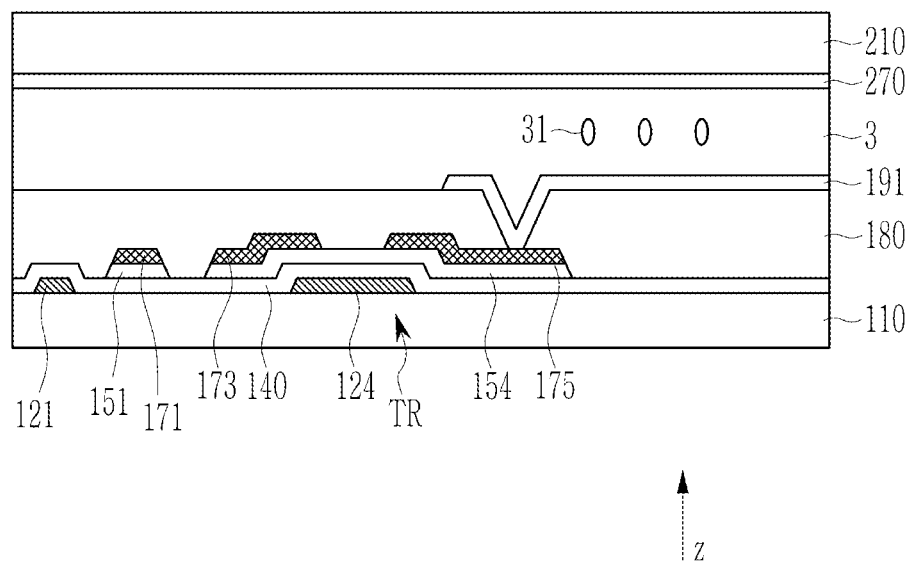
FIG. 10 is a schematic cross-sectional view of a liquid crystal panel according to an embodiment.
Figure 11:
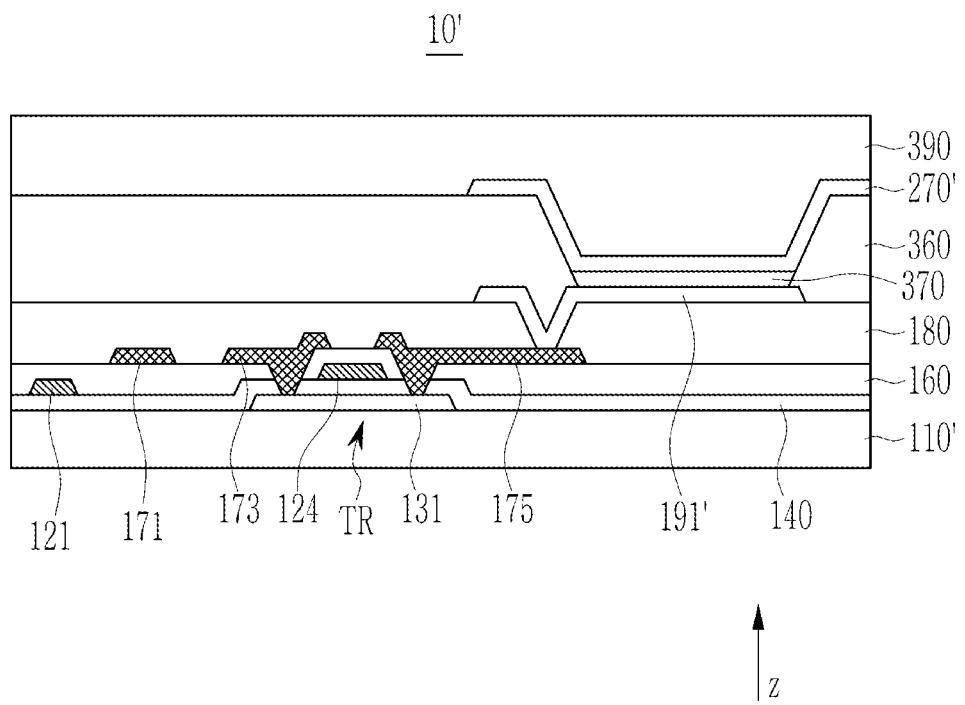
FIG. 11 is a schematic cross-sectional view of an organic light emitting panel according to an embodiment.

FIG. 10 is a schematic cross-sectional view of a liquid crystal display panel according to an embodiment, and FIG. 11 is a schematic cross-sectional view of an organic light emitting display panel according to an embodiment.

Referring to FIG. 10, the display panel 10 includes the substrate 110, and the signal lines and the elements which are formed of several layers disposed thereon.

The substrate 110 may be an insulation substrate that is optically transparent such as glass.

A gate conductor including a gate line 121 and a gate electrode 124 may be disposed on the substrate 110. The gate conductor may be formed by depositing and patterning a conductive material such as molybdenum (Mo), copper (Cu), aluminum (Al), silver (Ag), chromium (Cr), tantalum (Ta), and titanium (Ti) on the substrate 110. The test lines TL, the data connecting lines CL, and/or the pads PP as above-described may be formed of the same material in the same process as the gate conductor.

A gate insulating layer 140 may be disposed on the gate conductor. The gate insulating layer 140 may be formed by depositing an inorganic insulating material such as one of a silicon oxide ($SiO_x$) and a silicon nitride ($SiN_x$).

A semiconductor 151 and a semiconductor layer 154 of a transistor TR may be disposed on the gate insulating layer 140. The semiconductor 151 and the semiconductor layer 154 may include amorphous silicon, polysilicon, or an oxide semiconductor.

A data line 171 may be disposed on the semiconductor 151, and a source electrode 173 and a drain electrode 175 of the transistor TR may be disposed on the semiconductor layer 154. A data conductor including the data line 171, the source electrode 173, and the drain electrode 175 may include metals such as aluminum (Al), copper (Cu), silver (Ag), molybdenum (Mo), chromium (Cr), gold (Au), platinum (Pt), palladium (Pd), tantalum (Ta), tungsten (W), titanium (Ti), and nickel (Ni), or a metal alloy. The test lines TL, the data connecting lines CL, and/or the pads PP described above may be formed of the same material in the same process as the data conductor.

A planarization layer 180 may be disposed on the data conductor. The planarization layer 180 may include an organic insulating material, and may include an inorganic insulating material. The planarization layer 180 may be referred to as a passivation layer.

A pixel electrode 191 may be disposed on the planarization layer 180. The pixel electrode 191 may be connected to the drain electrode 175 through a contact hole forming in the planarization layer 180, thereby receiving a data signal. The pixel electrode 191 may be formed of a transparent conductive material such as one of indium tin oxide (ITO) and indium zinc oxide (IZO). The above-described pads PP may be formed of the same material in the same process as the pixel electrode 191.

A liquid crystal layer 3 including liquid crystal molecules 31 may be disposed on the pixel electrode 191, and a substrate 210 sealing the liquid crystal layer 3 along with the substrate 110 may be disposed on the liquid crystal layer 3. The liquid crystal layer 3 may be formed to be spaced apart in micro-spaces.

A common electrode 270 may be disposed between the liquid crystal layer 3 and the substrate 210. The common electrode 270 may be disposed to be isolated from the pixel electrode 191 below the liquid crystal layer 3. The common electrode 270 may be formed of the transparent conductive material such as ITO and IZO.

The display panel 10 may display an image by controlling the orientation of the liquid crystal molecules 31 by a pixel unit by an electric field generated by the voltages applied to the pixel electrode 191 and the common electrode 270 to adjust the transmittance. For a colored representation, the display panel 10 may include a color filter that overlaps the pixel electrode 191.

Referring to FIG. 11, an organic light emitting display panel 10' includes the substrate 110', and the signal lines and the elements which are formed of the several layer disposed thereon.

The substrate 110' may be a flexible substrate made of a polymer film. For example, the substrate 110' may be made of a plastic such as polyimide, polyamide, polyethylene terephthalate, etc. The substrate 110' may be a hard substrate made of glass or the like. The substrate 110' may include a barrier layer (not shown) for preventing diffusion of an impurity that degrades the semiconductor characteristic and preventing penetration of moisture or the like.

A semiconductor layer 131 of the transistor TR may be disposed on the substrate 110'. The semiconductor layer 131 may include a source region and a drain region, and a channel region between these regions. The semiconductor layer 131 may include the polysilicon, the oxide semiconductor, or the amorphous silicon. A buffer layer may be disposed between the substrate 110' and the semiconductor layer 131 to block an impurity diffused from the substrate 110' to the semiconductor layer 131 and to reduce stress of the substrate 110' in the process of forming the semiconductor layer 131. The buffer layer may include the inorganic insulating material such as a silicon oxide, a silicon nitride, and the like.

The gate insulating layer 140 may be disposed on the semiconductor layer 131, and the gate conductor including the gate line 121 and the gate electrode 124 of the transistor TR may be disposed on the gate insulating layer 140.

An interlayer insulating layer 160 may be disposed on the gate conductor. The interlayer insulating layer 160 may include the inorganic insulating material such as a silicon nitride, a silicon oxide, and the like.

The data conductor including the data line 171, and the source electrode 173 and the drain electrode 175 of the transistor TR may be disposed on the interlayer insulating layer 160. The source electrode 173 and the drain electrode 175 may be respectively connected to the source region and the drain region of the semiconductor layer 131 through contact holes formed in the interlayer insulating layer 160 and the gate insulating layer 140.

The planarization layer 180 may be disposed on the source electrode 173 and the drain electrode 175, and the pixel electrode 191' may be disposed on the planarization layer 180. The pixel electrode 191' may be connected to the drain electrode 175 through the contact hole formed in the planarization layer 180, thereby receiving the data signal. The pixel electrode 191' may be formed of the transparent conductive material such as indium tin oxide (ITO), indium zinc oxide (IZO), and the like.

An insulating layer 360 that may be referred to as a pixel definition layer may be disposed on the planarization layer 180. The insulating layer 360 has an opening overlapping the pixel electrode 191'. An emission layer 370 may be disposed on the pixel electrode 191' in the opening of the insulating layer 360, and the common electrode 270' may be disposed on the emission layer 370.

The pixel electrode 191' may include the transparent conductive material such as ITO and IZO. The pixel electrode 191' may be a multi-layer such as ITO/silver (Ag)/ITO or ITO/aluminum (Al). The common electrode 270' is formed by thinly laminating metals having low work functions such as calcium (Ca), barium (Ba), magnesium (Mg), aluminum (Al), silver (Ag), and the like to have a light transmitting property. The common electrode 270' may be formed of the transparent conductive material such as ITO and IZO.

The pixel electrode 191', the emission layer 370, and the common electrode 270' together constitute a light-emitting device, which may be an organic light emitting diode. The pixel electrode 191' may be an anode of the organic light emitting diode, and the common electrode 270' may be a cathode of the organic light emitting diode.

An encapsulation layer 390 may be disposed on the common electrode 270' to protect the light-emitting device and prevent moisture from entering the organic light emitting display panel 10'. The encapsulation layer 390 may be a thin film encapsulation layer or may be in the form of a substrate.

While example embodiments have been described, practical embodiments are not limited to the described embodiments. Practical embodiments are intended to cover various modifications and equivalent arrangements within the scope of the appended claims.

What is claimed is:

1. A display device comprising:
a substrate;
a circuit board;
pixels positioned on the substrate;
connecting lines;
pads electrically connected through the connecting lines to the pixels, positioned between the pixels and an edge of the substrate, and including a first pad and a second pad; and
conductive lines electrically connected through the pads to the connecting lines and including a first conductive line and a second conductive line,
wherein the first conductive line comprises a first first-line section and a second first-line section,
wherein the first first-line section is positioned closer to the edge of the substrate than the first pad,
wherein the second first-line section is positioned closer to the edge of the substrate than the first first-line section and is electrically connected through the first first-line section to the first pad,
wherein the second conductive line comprises a first second-line section and a second second-line section,
wherein the first second-line section is positioned closer to the edge of the substrate than the second pad,
wherein the second second-line section is positioned closer to the edge of the substrate than the first second-line section and is electrically connected through the first second-line section to the second pad,
wherein a minimum distance between the first first-line section and the first second-line section is larger than a minimum distance between the second first-line section and the second second-line section,
wherein the first first-line section and the first second-line section respectively directly contact the first pad and the second pad,
wherein the second first-line section and the second second-line section are respectively directly connected to the first first-line section and the first second-line section,
wherein each of the second first-line section and the second second-line section directly contacts the edge of the substrate, and wherein the circuit board overlaps each of the first pad, the second pad, the first first-line section, the second first-line section, the first second-line section, and the second second-line section.

2. The display device of claim 1, wherein each of an end of the second first-line section and an end of the second second-line section directly contacts the edge of the substrate.

3. The display device of claim 1, wherein the second first-line section and the second second-line section are inclined with respect to the edge of the substrate and converge toward an intersection of the edge of the substrate and a geometric center line of the conductive lines.

4. The display device of claim 1, wherein the second first-line section is a mirror image of the second second-line section with reference to a geometric center line of the conductive lines.

5. The display device of claim 1, wherein both the second first-line section and the second second-line section are straight.

6. The display device of claim 1,
wherein the pads further include a third pad,
wherein the conductive lines further include a third conductive line,
wherein the third conductive line comprises a first third-line section and a second third-line section,
wherein the second third-line section is positioned closer to the edge of the substrate than the first third-line section, is electrically connected through the first third-line section to the third pad, and is positioned between the second first-line section and the second second-line section,
wherein the second first-line section is oriented at a first acute angle relative to the edge of the substrate,
wherein the second third-line section is oriented at a second acute angle relative to the edge of the substrate, and
wherein the second acute angle is greater than the first acute angle.

7. The display device of claim 6,
wherein the pads further include a fourth pad,
wherein the conductive lines further include a fourth conductive line,
wherein the fourth conductive line comprises a first fourth-line section and a second fourth-line section,
wherein the second fourth-line section is positioned closer to the edge of the substrate than the first fourth-line section, is electrically connected through the first fourth-line section to the fourth pad, and is positioned between the second third-line section and the second second-line section,
wherein the second fourth-line section is oriented at a third acute angle relative to the edge of the substrate, and
wherein the third acute angle is greater than the second acute angle.

8. The display device of claim 1, wherein ends of the conductive lines directly contact the edge of the substrate and have unequal intervals.

9. The display device of claim 8,
wherein the conductive lines include conductive lines groups,
wherein the conductive line groups include a first conductive line group,
wherein the first conductive line group includes the first conductive line and the second conductive line, and
wherein the second first-line section and the second second-line section converge toward an intersection of the edge of the substrate and a geometric center line of the first conductive line group.

10. The display device of claim 1, wherein the second first-line section is not aligned with the first first-line section.

11. The display device of claim 1, wherein the first conductive line further comprises a third first-line section connected between the first first-line section and the second first-line section and being bent relative to each of the first first-line section and the second first-line section.

12. The display device of claim 1, wherein the second first-line section is curved.

13. The display device of claim 1, wherein the circuit board is a flexible printed circuit board overlapping the conductive lines.

14. The display device of claim 13, further comprising
an anisotropic conductive layer between the pads and the flexible printed circuit board,
wherein the anisotropic conductive layer does not overlap the conductive lines.

15. The display device of claim 1, further comprising
a flexible printed circuit board overlapping the pads, overlapping the conductive lines, and bonded to the substrate.

16. The display device of claim 1, wherein distances between the second first-line section and the second second-line section decrease toward the edge of the substrate.

17. The display device of claim 1, wherein the first conductive line includes two or more bends.

18. The display device of claim 1, wherein at least one of the first first-line section and the second first-line section is curved.

19. The display device of claim 1, wherein the first conductive line is not positioned between the second conductive line and any of the conductive lines.

* * * * *